United States Patent
Zhao et al.

(10) Patent No.: US 7,851,881 B1
(45) Date of Patent: Dec. 14, 2010

(54) SCHOTTKY BARRIER DIODE (SBD) AND ITS OFF-SHOOT MERGED PN/SCHOTTKY DIODE OR JUNCTION BARRIER SCHOTTKY (JBS) DIODE

(75) Inventors: Feng Zhao, Columbia, SC (US); Bruce Odekirk, Bend, OR (US); Dumitru Sdrulla, Bend, OR (US)

(73) Assignee: Microsemi Corporation, Bend, OR (US)

( * ) Notice: Subject to any disclaimer, the term of this patent is extended or adjusted under 35 U.S.C. 154(b) by 0 days.

(21) Appl. No.: 12/365,083

(22) Filed: Feb. 3, 2009

Related U.S. Application Data

(60) Provisional application No. 61/038,680, filed on Mar. 21, 2008.

(51) Int. Cl.
  *H01L 29/47* (2006.01)
(52) U.S. Cl. ............... 257/471; 257/155; 257/449; 257/E51.009; 257/E33.051; 257/E29.148
(58) Field of Classification Search ......... 438/570, 438/571, FOR. 181; 257/155, 449, 471, 257/E51.009, E33.051, E29.148
See application file for complete search history.

(56) References Cited

U.S. PATENT DOCUMENTS

| | | | |
|---|---|---|---|
| 5,355,014 A * | 10/1994 | Rao et al. ............... | 257/533 |
| 6,104,043 A | 8/2000 | Hermansson et al. | |
| 6,399,996 B1 * | 6/2002 | Chang et al. ............ | 257/484 |
| 6,462,393 B2 | 10/2002 | Buchanan et al. | |
| 6,501,145 B1 | 12/2002 | Kaminski et al. | |
| 6,524,900 B2 | 2/2003 | Dahlqvist et al. | |
| 6,710,419 B2 | 3/2004 | Buchanan et al. | |
| 6,861,723 B2 | 3/2005 | Willmeroth | |
| 6,949,401 B2 | 9/2005 | Kaminski et al. | |
| 2002/0125541 A1* | 9/2002 | Korec et al. ............ | 257/471 |
| 2002/0179909 A1* | 12/2002 | Uchida et al. ............ | 257/73 |
| 2004/0046224 A1* | 3/2004 | Rossel et al. ............ | 257/471 |
| 2005/0161759 A1* | 7/2005 | Chiola et al. ............ | 257/471 |
| 2006/0035422 A1* | 2/2006 | He et al. ................. | 438/167 |
| 2006/0189107 A1* | 8/2006 | Chiola et al. ............ | 438/570 |

OTHER PUBLICATIONS

Gilmartin, S.F. et al., "A 1000V Merged P-N/Schottky (MPS) High-Speed Low-Loss Power Rectifier," Power Electronics and Variable Speed Drives, IEEE Publication No. 456, pp. 375-380, Sep. 21-23, 1998.

Kaminski, Nando et al., "1200V Merged PIN Schottky Diode with Soft Recovery and Positive Temperature Coefficient," ABB Semiconductors AG, pp. 1-9, Lusanne, Sep. 1999.

(Continued)

*Primary Examiner*—Michelle Estrada
(74) *Attorney, Agent, or Firm*—Marger, Johnson & McCollom, P.C.

(57) ABSTRACT

A merged PN/Schottky diode is provided having a substrate of a first conductivity type and a grid of doped wells of the second conductivity type embedded in the substrate. A Schottky barrier metal layer makes a Schottky barrier contact with the surface of the substrate above the grid. Selected embedded wells in the grid make a Schottky barrier contact to the Schottky barrier metal layer, while most embedded wells do not. The diode forward voltage drop is reduced for the same diode area with reverse blocking benefits similar to a conventional JBS structure.

33 Claims, 11 Drawing Sheets

OTHER PUBLICATIONS

Baliga, B. Jayant, Analysis of a High-Voltage Merged p-i-n/Schottky (MPS) Rectifier, IEEE Electron Device Letters, vol. EDL-8, No. 9, Sep. 1987.

Tu, Shang-Hui L., et al., Controlling the Characteristics of the MPS Rectifier by Variation of Area of Schottky Region, IEEE Transactions on Electron Devices, vol. 40, No. 7, pp. 1307-1315, Jul. 1993.

Baliga, B.J., "The Pinch Rectifier: A Low-Forward-Drop High-Speed Power Diode," IEEE Electron Device Lett., vol. EDL-5, pp. 194-196, 1984.

Hefner, Jr., A., et al., Silicon Carbide Merged PiN Schottky Diode Switching Characteristics and Evaluation for Power Supply Applications, Industry Applications Conference, 2000. Conference Record of the 2000 IEEE, vol. 5, pp. 2948-2954, Oct. 8, 2000, Rome, Italy.

* cited by examiner

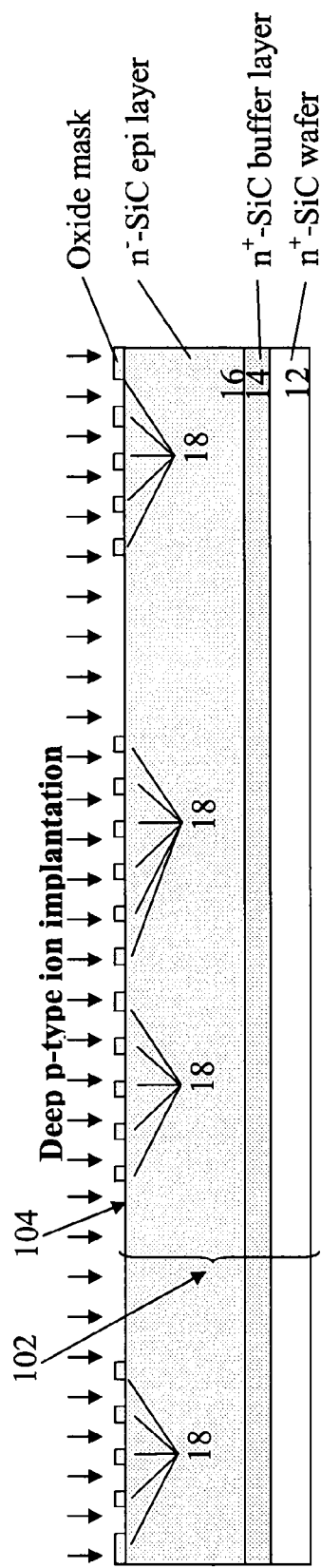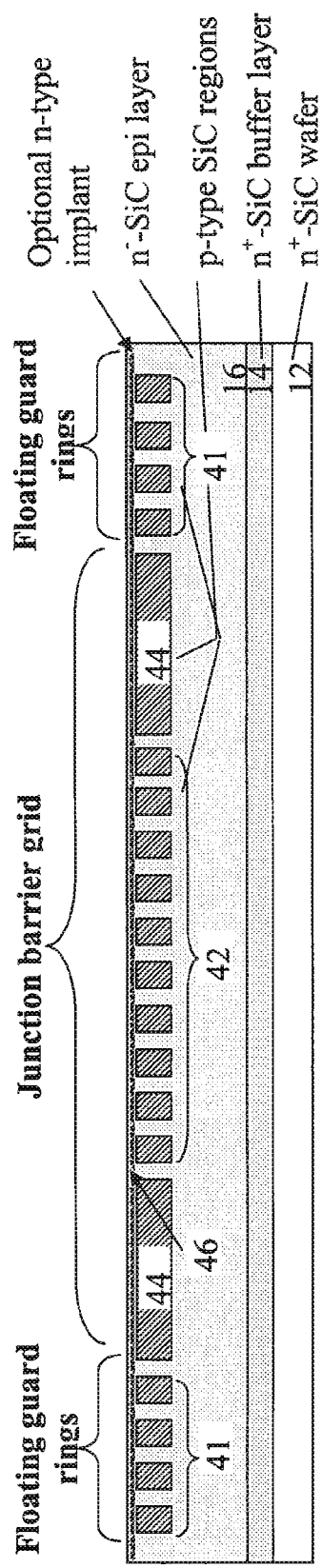
FIG. 3A
FIG. 3B

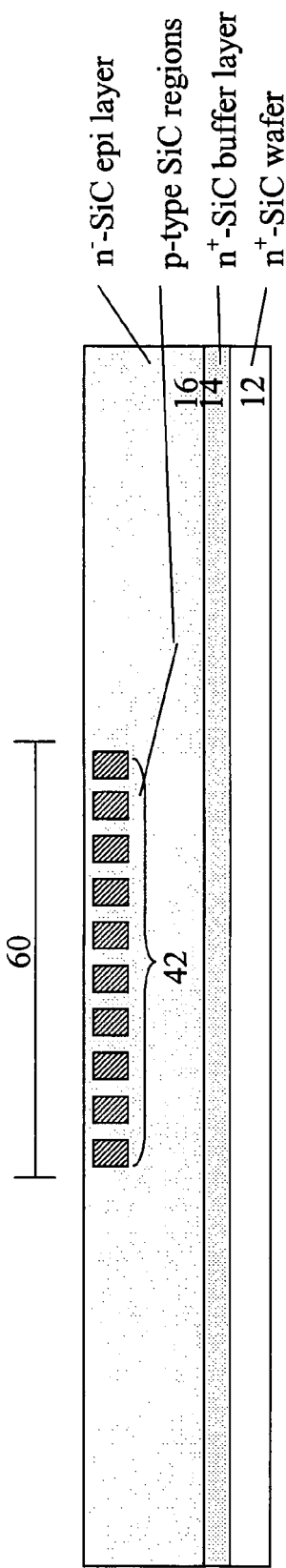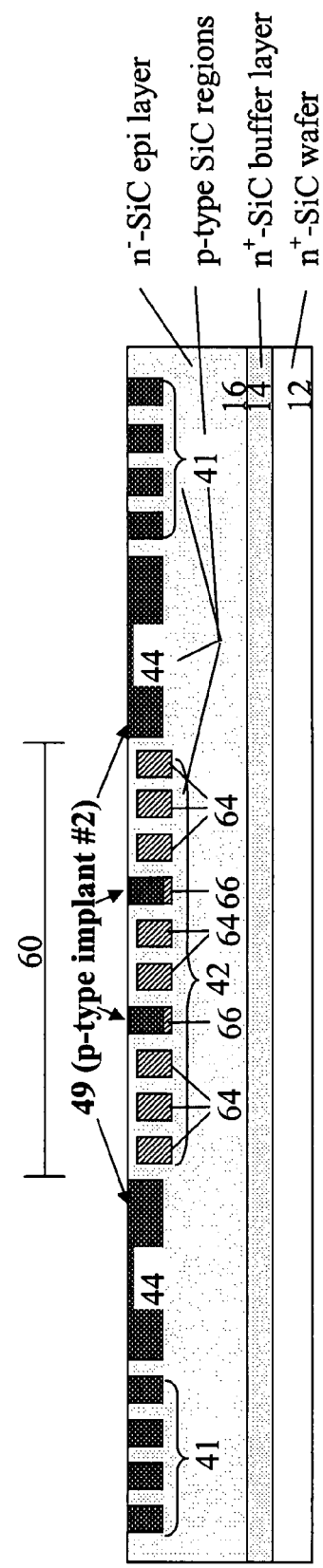
FIG. 5C
FIG. 5D

SCHOTTKY BARRIER DIODE (SBD) AND ITS OFF-SHOOT MERGED PN/SCHOTTKY DIODE OR JUNCTION BARRIER SCHOTTKY (JBS) DIODE

RELATED APPLICATION DATA

This application claims the benefit of U.S. provisional application Ser. No. 61/038,680, filed Mar. 21, 2008, incorporated by reference herein.

BACKGROUND OF THE INVENTION

1. Technical Field

This invention relates generally to semiconductor devices and semiconductor device fabrication, and more particularly to MPS (merged PN/Schottky) devices and fabrication.

2. Discussion of Related Art

B. J. Baliga, The Pinch Rectifier: A Low-Forward-Drop High-Speed Power Diode, IEEE Electron Device Letters, June 1984, pp. 194-196, Vol. 5, Issue 6 describes a Schottky barrier diode with a junction grid placed under and in contact with the Schottky metal. The junction grid pinches off current flow under reverse bias but not under forward bias.

Shang-hui L. Tu & B. Jayant Baliga, Controlling the Characteristics of the MPS Rectifier by Variation of Area of Schottky Region, IEEE Transactions on Electron Devices, July 1993, pp. 1307-1315, Vol. 40, Issue 7 describes varying the characteristics of an MPS diode (such as forward voltage drop, breakdown voltage, leakage current, and reverse recovery time) by varying the ratio of Schottky junction region area to p-n junction region area.

A. Hefner, Jr. & D. Berning, Silicon Carbide Merged PiN Schottky Diode Switching Characteristics and Evaluation for Power Supply Application, Conference Record of the 2000 IEEE Industry Applications Conference, 8-12 Oct. 2000, pp. 2948-2954 describes a 1500 volt, 0.5 amp silicon carbide based MPS diode. The diode is able to operate at higher temperatures than a comparable silicon based MPS diode, and has low on-state voltage drop, low off-state leakage, and fast switching characteristics.

U.S. Pat. No. 6,462,393 describes an MPS diode with an array of buried $P^+$ areas.

U.S. Pat. No. 6,710,419 describes a method of manufacturing an MPS diode with an array of buried $P^+$ areas.

A need remains for an MPS diode having improved Schottky area and reduced resistance.

SUMMARY OF THE INVENTION

The invention combines in a diode the relatively lower forward voltage drop of a Schottky diode with the relatively lower reverse leakage current of a P-N junction diode by implementing an MPS (merged PN/Schottky) design so as to increase the Schottky active area of the MPS diode by embedding wells of a second conductivity beneath the surface of a substrate of a first conductivity. An advantage of the invention is to reduce the diode forward voltage drop by embedding the wells.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIGS. 3A-3I are diagrams showing a fabrication process in accordance with an embodiment of the invention.

FIG. 3A is a cross-sectional view of a wafer covered by a buffer layer and further covered by an epitaxial drift layer into which ion implantation is carried out through a patterned oxide mask.

FIG. 3B is a cross-sectional view of a peripheral region, floating guard ring regions, and grid p-wells formed in the epitaxial drift layer of FIG. 3A, along with an optional n-type implant.

FIG. 3C is a cross-sectional view showing the removal of a surface portion of the epitaxial drift layer of FIG. 3B in the areas of the peripheral region, the floating guard ring regions, and selected grid p-wells, along with the optional n-type implant of FIG. 3B in such cases.

FIG. 3D is a cross-sectional view showing the removal of a surface portion of the epitaxial drift layer of FIG. 3B in the areas of the peripheral region, the floating guard ring regions, and selected grid p-wells, without the optional n-type implant of FIG. 3B.

FIG. 3E is a cross-sectional view showing the deposition of a first dielectric layer on the peripheral region, floating guard ring regions, and selected grid p-wells of FIG. 3D, and the formation of a backside ohmic contact.

FIG. 3F is a cross-sectional view showing the formation of openings in the passivation layer above the peripheral region and selected grid p-wells of FIG. 3E, and showing the deposition of a Schottky barrier metal layer in the area of those openings.

FIG. 3G is a cross-sectional view showing the formation of an anode contacting the Schottky barrier metal layer of FIG. 3F.

FIG. 3H is a cross-sectional view showing the formation of a second dielectric layer on the anode, on portions of the Schottky barrier metal layer, and on portions of the first dielectric material of FIG. 3G.

FIG. 3I is a cross-sectional view showing the creation of an opening in the second dielectric layer of FIG. 3H, and showing the formation of a cathode contacting the ohmic contact of FIGS. 3E-3H.

FIG. 5C is a cross-sectional diagram showing a first implant step of another embodiment in a process to avoid etching the material.

FIG. 5D is a cross-sectional diagram showing a second implant step of the process to avoid etching the material in the embodiment of FIG. 5C.

DETAILED DESCRIPTION

Figure 1:
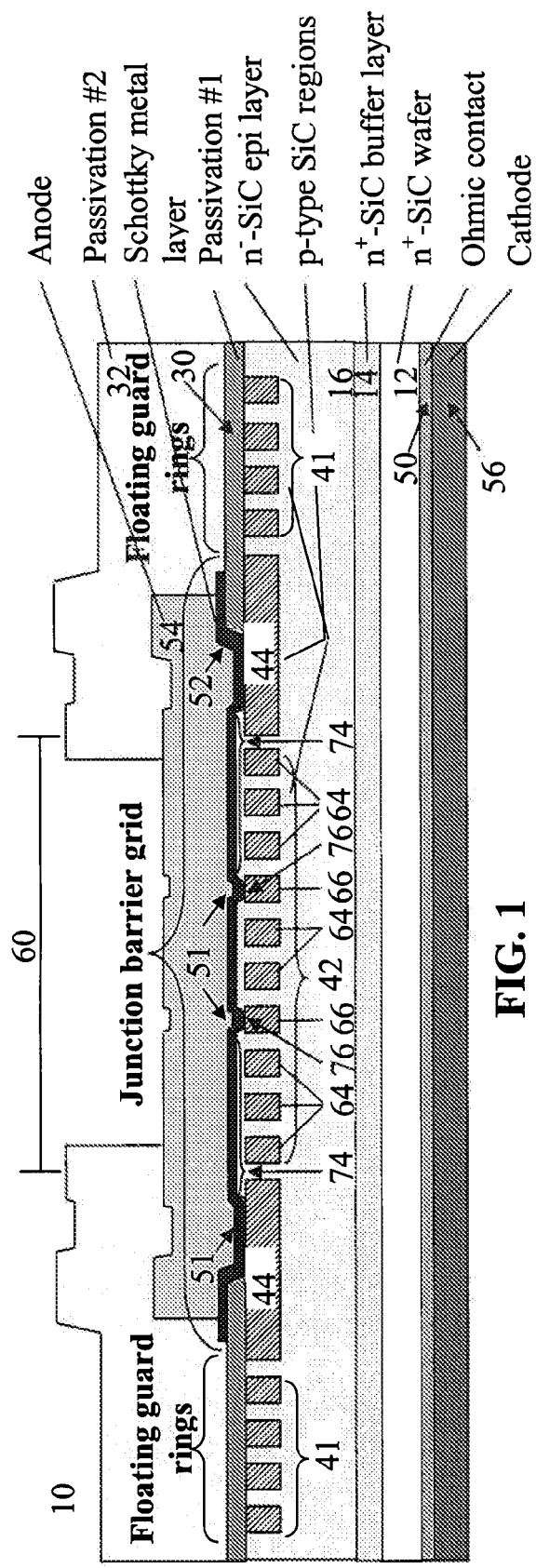
FIG. 1 is a cross-sectional diagram showing an embedded junction barrier grid according to an embodiment of the invention.
Figure 2:
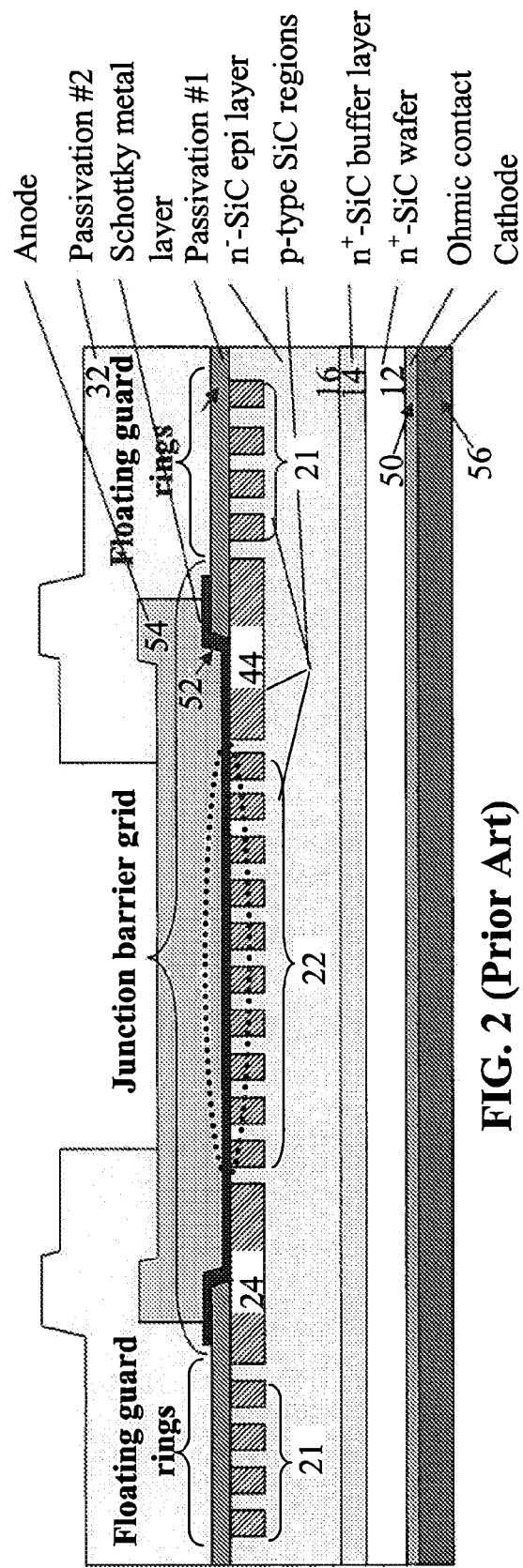
FIG. 2 is a cross-sectional diagram showing a conventional prior art JB (Junction Barrier) Schottky structure.

FIG. 1 is a cross-sectional diagram showing an embodiment of the embedded junction barrier grid according to an embodiment of the invention. FIG. 2 is a cross-sectional diagram showing a conventional prior art JB (Junction Barrier) Schottky structure.

Referring to FIG. 1, a new SiC SBD (Schottky barrier diode) structure 10 with an "embedded" junction barrier grid is disclosed. As shown in FIG. 1, the embedded junction bather grid is drawn schematically and the layers are identified to illustrate an n-type SiC material with a p-type junction bather grid. The concept applies equally well to a p-type SiC material employing an n-type junction barrier grid. The grid spacing is shown for ease of illustration and should be sufficiently wide to avoid obstructing current flow or causing forward voltage to rise. For a 1200V SiC Schottky diode, the p-well width can be 1 to 3 μm wide with a spacing of 4 to 8 p.m.

A conventional prior art JB Schottky structure (resembling the structure described in Baliga, The Pinch Rectifier: A Low-Forward-Drop High-Speed Power Diode) is shown in FIG. 2. Compared to the conventional SiC JB Schottky diode of FIG. 2, the new structure comprises a p-n junction grid which does not reach the surface for essentially all of the grid area. This feature of the new structure efficiently increases the active Schottky area which lowers the forward voltage drop and at the same time maintains the excellent reverse blocking voltage and low leakage current of prior art structures with improved current capability.

The junction barrier grid in FIG. 1 includes a grid 42 of p-type regions 64, 66 with width and spacing characteristic of the drift region doping concentration surrounded by a wide peripheral p-type region 44. Unlike the corresponding conventional grid structure 22 in FIG. 2, most of the grid 42 in the new structure is not at the surface of n⁻-SiC drift layer 16, but rather is at a depth (e.g., 0.5-1.5 μm) below the upper surface of layer 16, being formed of "embedded p-wells." Since most of the embedded p-wells 64 of the grid 42 do not contact Schottky barrier metal layer 52 directly, the area of Schottky barrier contact 74 is essentially the entire top surface of the active area 60.

The wide peripheral p-type region 44 connects to some of the embedded p-wells 66 via the Schottky barrier metal layer 52, through recesses 51 in the semiconductor, to define the p-grid potential. Resistance from the peripheral p-type region 44 along the embedded p-wells is reduced by a selected number of vias 51 etched through an upper portion of the n⁻-SiC drift layer 16 to reach selected p-wells 66 in the grid 42 of embedded p-wells within the central active area 60 of the device.

Figure 2A:
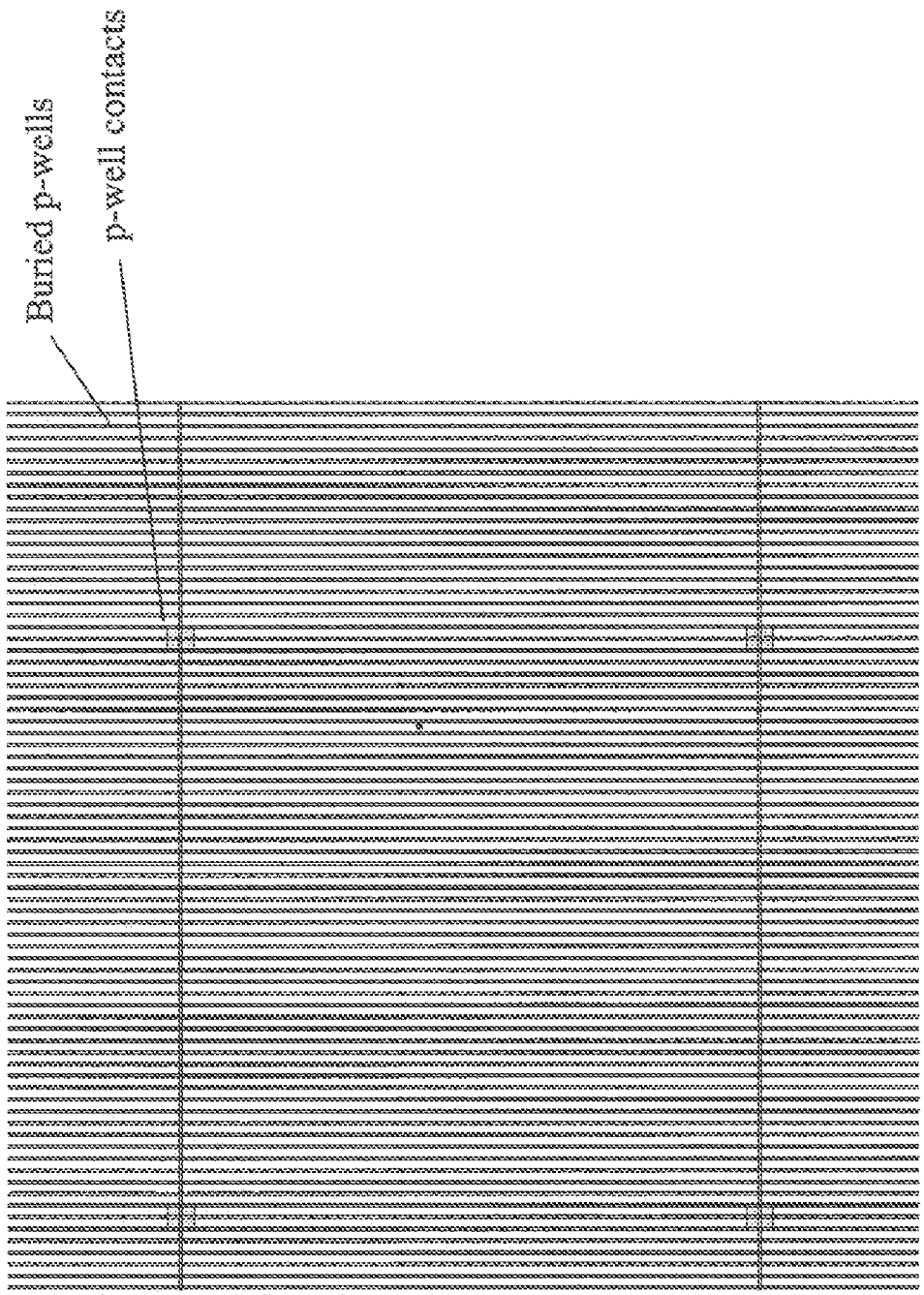
FIG. 2A is a plan view showing a two-dimensional "embedded network" of p-wells in accordance with an embodiment of the invention.

FIG. 2A is a plan view showing a two-dimensional "embedded network" of p-well stripes in accordance with an embodiment of the invention.

Referring to FIG. 2A, a selected number of embedded p-wells can also be created in the direction parallel to the page to create a 2-dimensional "embedded network" to reduce p-well resistance. Schottky barrier metal layer 52 contacts the selected p-wells 66 through the recesses 51 in the ensuing metallization process.

Referring to FIG. 2, the n⁻-SiC drift layer 16 on top of floating guard rings 41 at the periphery of the device is also etched off at the same time the recesses 51 are created to allow the p-type doped guard ring regions 41 to reach the surface. The surface is then passivated to provide stable high voltage blocking capability.

Figures 3C, 3D:
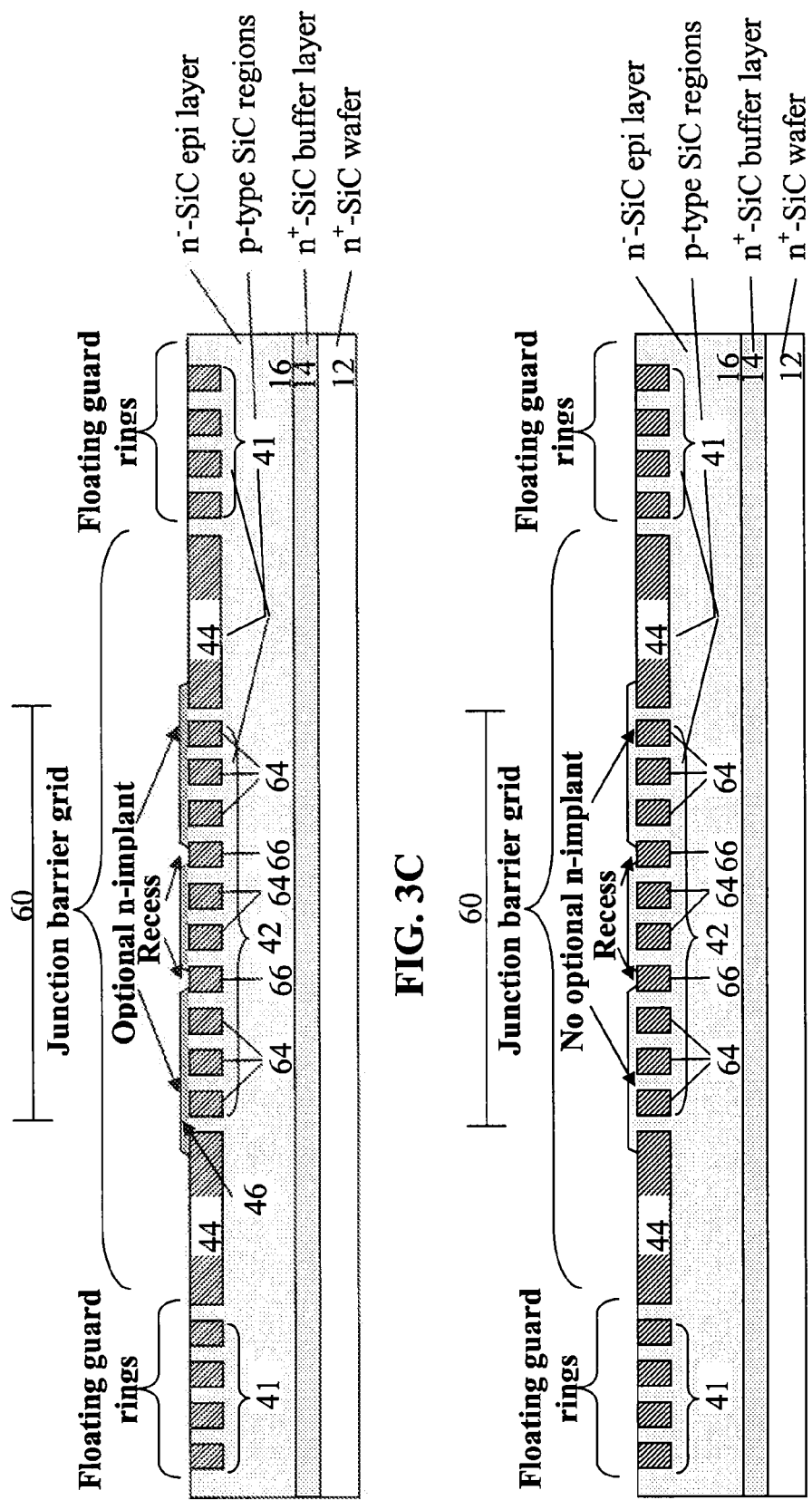

FIGS. 3A-3I are diagrams showing a fabrication process in accordance with an embodiment of the invention. FIG. 3A is a cross-sectional view of a wafer 12 covered by a buffer layer 14 and further covered by an epitaxial drift layer 16 into which ion implantation is carried out through a patterned oxide mask 18. FIG. 3B is a cross-sectional view of a peripheral region 44, floating guard ring regions 41, and grid 42 p-wells formed in the epitaxial drift layer 16 of FIG. 3A, along with an optional n-type implant 46.

Referring to FIGS. 3A and 3B, a substrate 102 of starting material having an upper surface 104 may include an n-SiC epitaxial drift layer 16 on top of a heavily doped n⁺-buffer layer 14 on top of an n⁺ wafer 12. SiC is used throughout for ease of discussion. The same principle applies to Schottky Barrier Diode made on all commonly known semiconductor materials such as germanium, silicon, GaAs, GaN, InP, diamond, and ternary derivatives involving II-VI compounds, etc. Example doping concentrations are: for n⁺ wafer 12, $5 \times 10^{17}$-$1 \times 10^{19}$ cm⁻³; for n⁺-buffer layer 14, $5 \times 10^{17}$-$1 \times 10^{19}$ cm⁻³; and for n-SiC epitaxial drift layer 16, $1 \times 10^{15}$-$1 \times 10^{17}$ cm⁻³.

An implant blocking mask 18 is created on the top surface as shown in FIG. 3A by depositing and patterning an oxide layer of sufficient thickness. A 2 μm thick oxide would be sufficient for implant energy around 200 KeV for aluminum. Appropriate blocking mask 18 thickness is well-known in the art and can be modified for different implant energy and species.

Next, p-type ions are embedded below the surface 104 using a single or multiple ion implantation steps to create p-type regions 41, 42, and 44. Care is taken to ensure the peak of the p-dopant profile is deep (0.5-1.5 μm) within the semiconductor and the tail of the p-type implant does not encroach upon and alter the n⁻ surface doping level appreciably. For example, an aluminum dose of between $1 \times 10^{13}$ and $6 \times 10^{15}$/cm² at 170~400 KeV (for example, $1 \times 10^{14}$/cm² at 370 KeV) may be employed for the p-type regions 41, 42, and 44. An optional layer 46 of shallow n-type implant of between $1 \times 10^{11}$ and $1 \times 10^{13}$/cm² may be implanted between the top surface and the embedded p-well (e.g. to a depth of 0.2-0.5 μm) to ensure retaining the desired n-type doping level at the surface. Following implant activation, the p-type regions 41, 42, and 44 and the optional shallow n-type implant layer 46 are established as shown in FIG. 3B.

FIG. 3C is a cross-sectional view showing the removal of a surface portion of the epitaxial drift layer 16 of FIG. 3B in the areas of the peripheral region 44, the floating guard ring regions 41, and selected grid p-wells 66, along with the optional n-type implant 46 of FIG. 3B in such cases. FIG. 3D is a cross-sectional view showing the removal of a surface portion of the epitaxial drift layer 16 of FIG. 3B in the areas of the peripheral region 44, the floating guard ring regions 41, and selected grid p-wells 66, without the optional n-type implant 46 of FIG. 3B.

Referring to FIGS. 3C and 3D, an etch step is performed to remove a shallow surface portion of layer 16, including the optional n-layer 46, at selected locations above the grid 42 in the active area 60, above the peripheral region 44, and in the area of the guard ring regions 41 of the device to selectively expose embedded p-type regions 41, 42, and 44. This etch step creates both selected embedded p-wells 66 to which contact can be made at the upper surface 104 and remaining embedded p-wells 64 to which contact cannot be made at the upper surface 104, as shown in FIG. 3C. (The peripheral etch establishes the guard ring regions 41 for blocking high voltage while the etch at selected locations above the grid 42 in the active area 60 will allow a Schottky barrier metal layer 52 to link to the peripheral regions 44 and the selected p-wells 66 of the embedded p-well network.) FIG. 3D shows a construction without the optional n-implant 46 at the surface. An example etch depth is 0.5-1.0 µm.

Figure 3E:
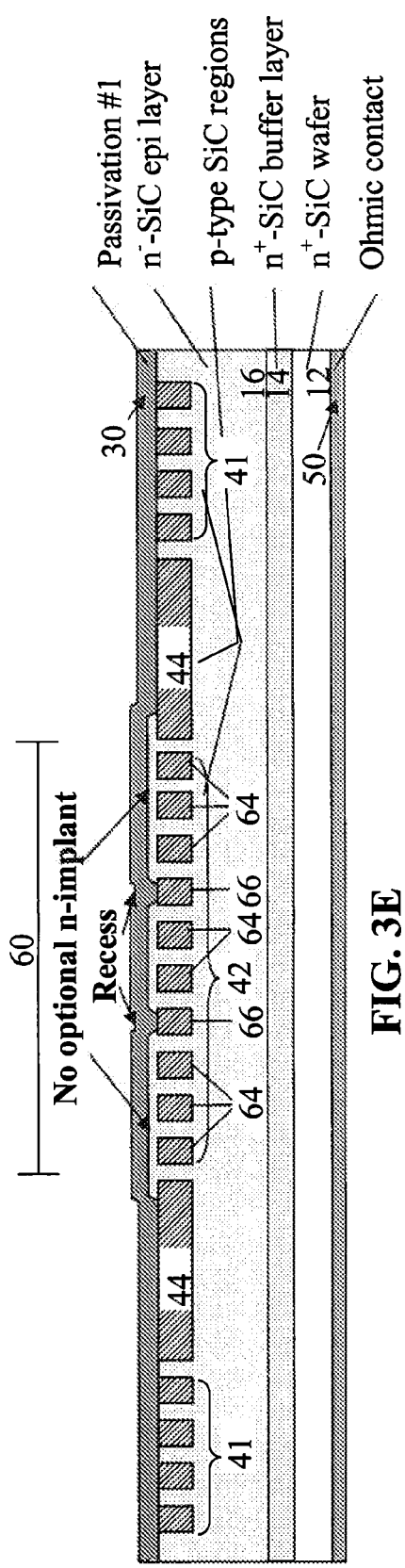

FIG. 3E is a cross-sectional view showing the deposition of a first dielectric layer 30 on the peripheral region 44, floating guard ring regions, and selected grid p-wells 66 of FIG. 3D, and the formation of a backside ohmic contact 50.

Referring to FIG. 3E, the top surface is next thermally oxidized to grow a thin layer of oxide followed with deposition of dielectric material 30 to prepare the surface for high voltage. Since very high surface electric field is present at the surface in the area of the guard rings 41, the dielectric material in conjunction with the semiconductor surface must have the desirable characteristics of possessing high dielectric strength, low flatband voltage, low polarizability, and low charge trapping. Most dielectric films deposited using Plasma Enhanced Chemical Vaper Deposition (PECVD) polarize and trap charges under high electric field. The task is to minimize these adverse effects with specific guard ring geometry. Undoped oxide, oxynitride, PSG (phosphorus doped silicon glass), BPSG (boron and phosphorus doped silicon glass), or combinations thereof have been known to have the aforementioned adverse effects minimized and made usable for specific guard ring designs. This layer 30 is shown in FIG. 3E. An example thickness is 0.5-1.5 µm.

Following dielectric film deposition, nickel is deposited by sputter deposition or evaporation onto the backside as shown in FIG. 3E. A thermal process can be performed to form a nickel-silicide ohmic contact 50 to the n+ SiC wafer 12, with an example thickness of 0.1 µm. A Rapid Thermal Process (RTP) or Rapid Thermal Anneal (RTA) may be used for this operation. Alternatively, a diffusion furnace may be used to form the ohmic contact. To ensure nickel does not form an oxide which is difficult to remove, an inert gas with low moisture content such as Argon is used as carrier gas during the thermal process.

Figure 3F:
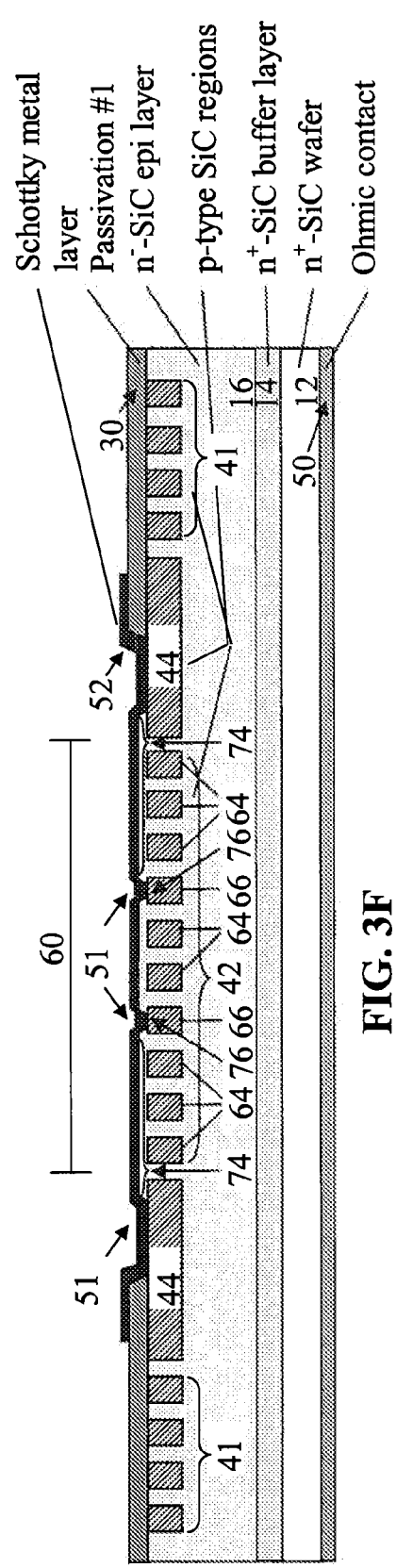

FIG. 3F is a cross-sectional view showing the formation of openings in the passivation layer 30 above the peripheral region 44 and selected grid p-wells 66 of FIG. 3E, and showing the deposition of a Schottky bather metal layer 52 in the area of those recesses. Referring to FIG. 3F, in the next step, the dielectric film 30 on the front of the device is patterned to provide an opening for a Schottky bather contact 74 to the n−-SiC epitaxial layer and a Schottky barrier contact 76 to the selected embedded p-wells 66 in the active area 60 through the selected recesses 51 formed by the previous etch step of the semiconductor, as well as a Schottky bather contact to the peripheral guard ring region 44. The Schottky bather metal layer 52 can be deposited unto the top surface by sputter deposition or evaporation of titanium, tungsten, chromium, nickel, or other suitable metal or alloys to form different bather heights. If a lift-off process as is commonly known in the art is employed, no metal etching will be necessary to define the top metal pattern. Alternatively, a masking and etch procedure can be followed to achieve the same objective of defining the top metal pattern. Compared to the nickel bather, the lower bather height of titanium gives lower forward voltage drop, while the higher reverse leakage current due to the lower barrier height can be suppressed by the embedded p-well structure. The Schottky bather metal layer 52 also overlaps onto the oxide layer 30 as shown in FIG. 3F. An example thickness for Ni is 0.1 µm; or 0.1 µm for Ti. A forming gas (hydrogen containing gas) anneal (FGA) at an elevated temperature is performed on the device to reduce the resistance of the Schottky bather contacts 74, 76, and 78 and therefore improve the forward characteristics.

Figure 3G:
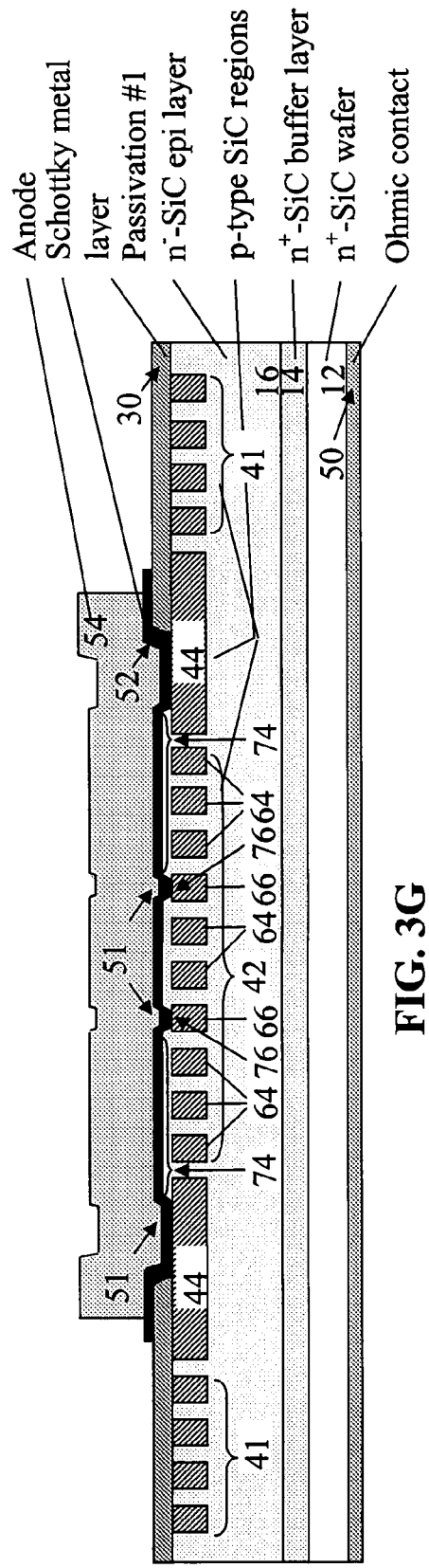
Figure 3H:
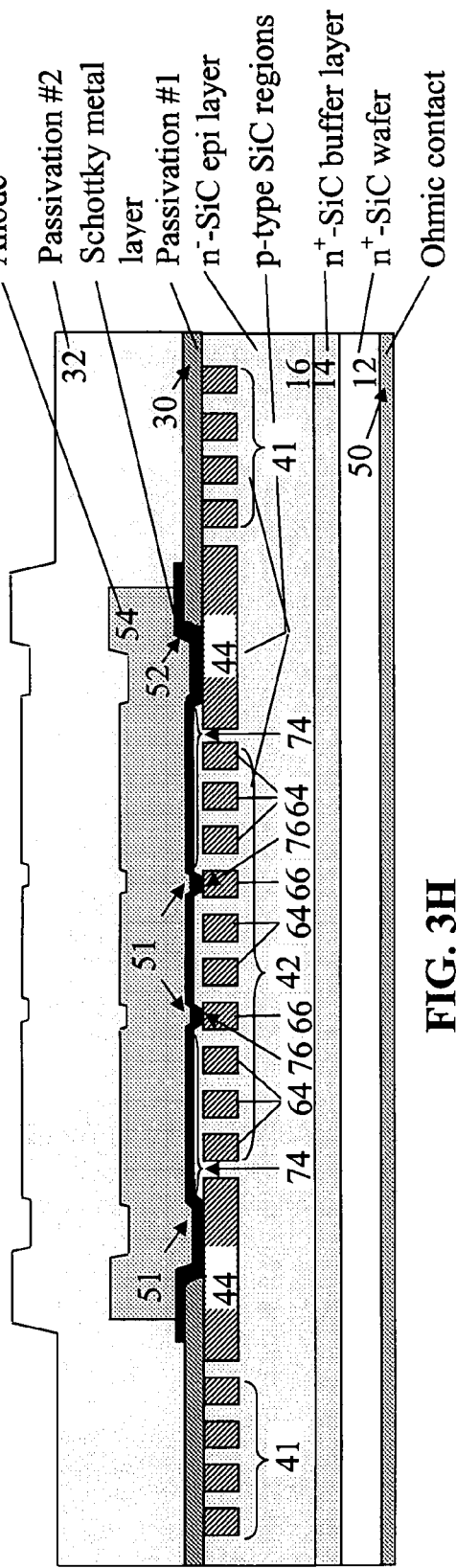

FIG. 3G is a cross-sectional view showing the formation of an anode 54 contacting the Schottky bather metal layer 52 of FIG. 3F. FIG. 3H is a cross-sectional view showing the formation of a second dielectric layer 32 on the anode 54, on portions of the Schottky barrier metal layer 52, and on portions of the first dielectric material 30 of FIG. 3G.

Referring to FIGS. 3G and 3H, to conduct high current out of the device, a front-side anode electrode 54 is formed such as by depositing tungsten, aluminum or aluminum alloys (e.g. at a thickness of 1-5 µm) using sputter deposition or evaporation followed by a patterning and etch step. This construction is illustrated in FIG. 3G. Next the device surface is covered by another dielectric material 32 for final passivation, as shown in FIG. 3H. The dielectric material 32 may be the same as or different from layer 30 but with similar desirable characteristics as suggested previously, including undoped oxide, oxynitride, PSG (phosphorus doped silicon glass), BPSG (boron and phosphorus doped silicon glass), or their combinations. Polyimide is also widely used for this purpose.

Figure 3I:
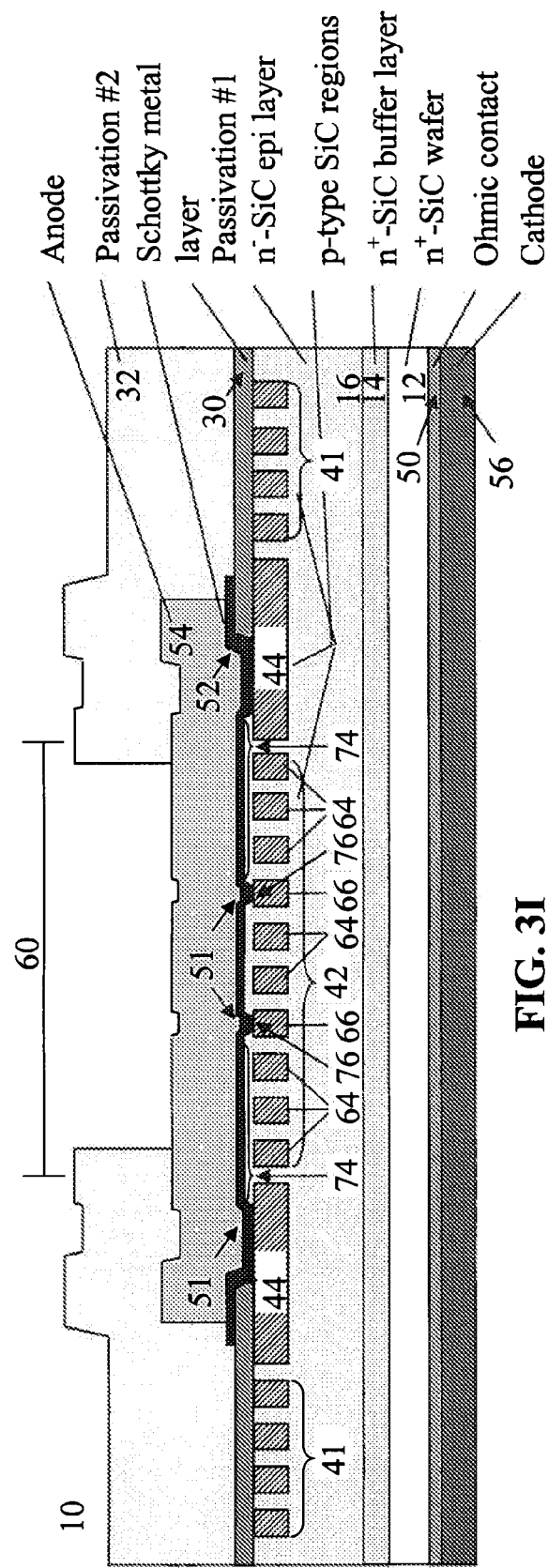

FIG. 3I is a cross-sectional view showing the creation of an opening in the second dielectric layer 32 of FIG. 3H, and showing the formation of a cathode 56 contacting the ohmic contact 50 of FIGS. 3E-3H.

Referring to FIG. 3I, an opening in the final passivation 32 is created so the device can receive wire-bonding to the anode 54. The die-attach metal 56 which also works as cathode electrode of the diode, usually a triple layer of titanium, nickel and silver, is evaporated or sputtered onto the back-side of the device in contact with the ohmic contact metal 50. The final device structure 10 is shown in FIG. 3I.

Figure 4A:
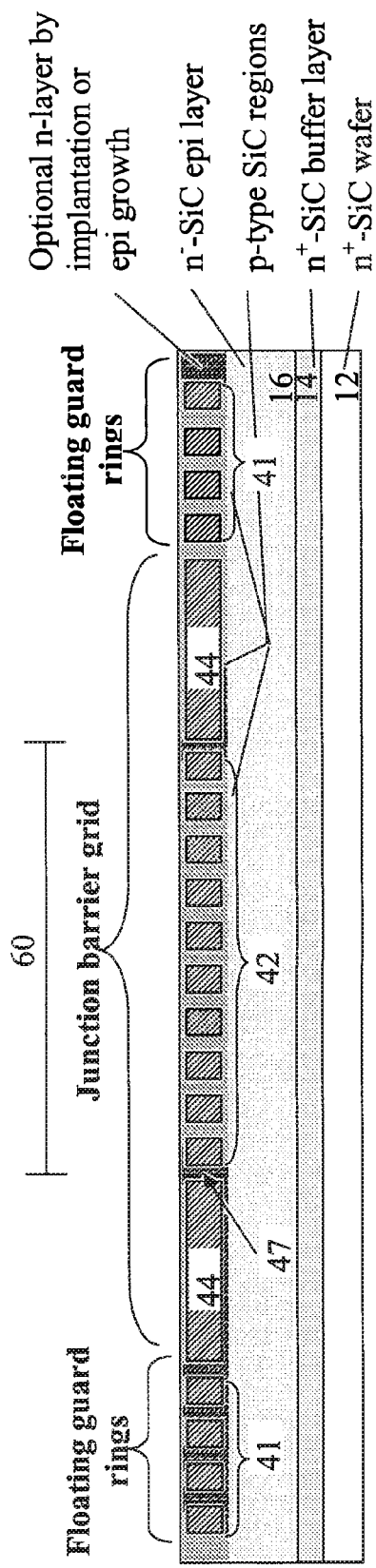
FIG. 4A is a cross-sectional diagram of an alternative embodiment showing an n-type implant region across the whole device.
Figure 4B:
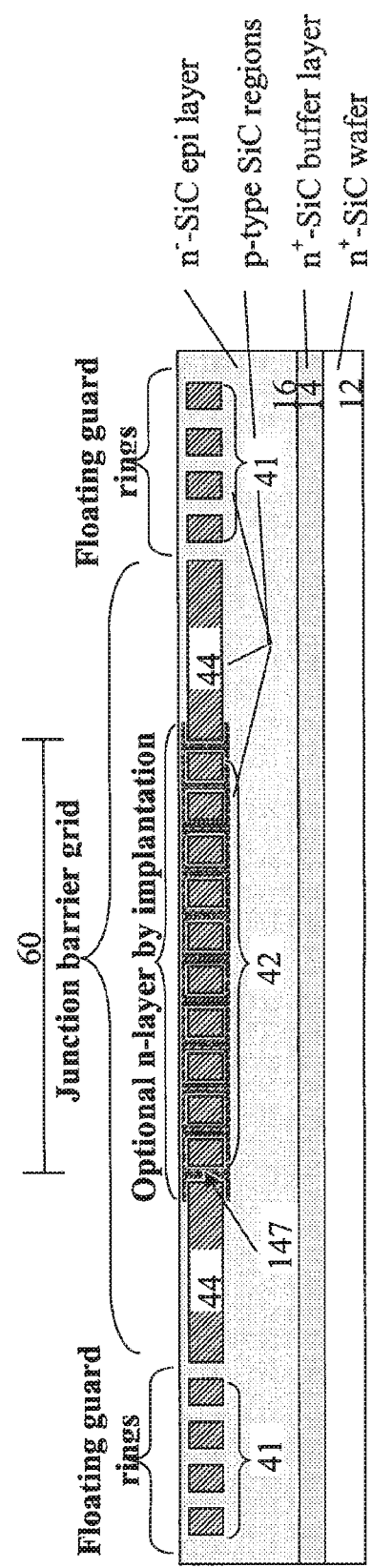
FIG. 4B is a cross-sectional diagram of a variation showing an n-type implant region formed only in the active area of the whole device.

FIG. 4A is a cross-sectional diagram of an alternate embodiment showing an n-type implant region 47 across the whole device. FIG. 4B is a cross-sectional diagram of a variation showing an n-type implant region 147 formed only in the active area of the whole device.

Referring to FIGS. 4A and 4B, to reduce the resistance between the adjacent p-wells, an optional n-type layer 47 can be added on top of the SiC drift layer 16 before the deep p-type ion implantation, by either epitaxial growth with a doping concentration between $1 \times 10^{16}$ and $1 \times 10^{17}/cm^3$, or an n-type implantation with dose between $1 \times 10^{11}$ and $1 \times 10^{13}/cm^2$. The n-type implant region 47 can extend across the whole device as shown in FIG. 4A, or an n-type implant region 147 can be formed just in the active area 60 as shown in FIG. 4B.

Figure 5A:
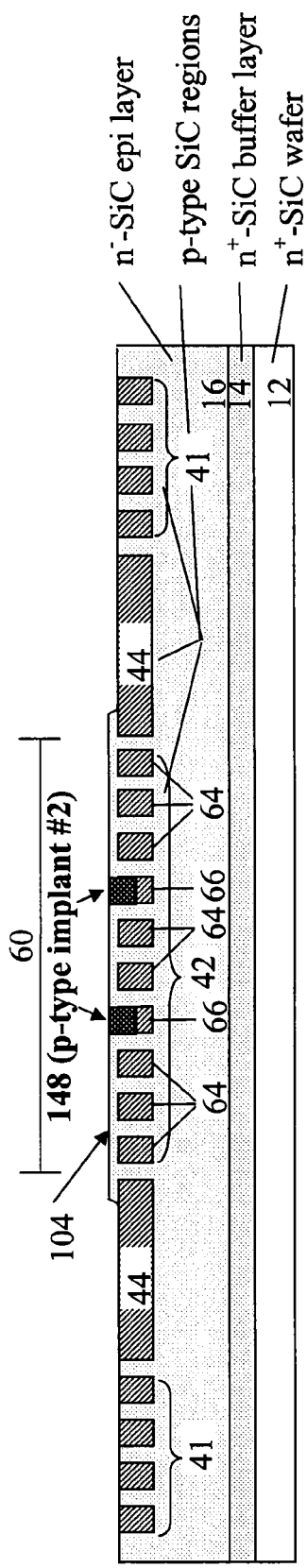
FIG. 5A is a cross-sectional diagram of another embodiment showing a second p-type implant in selected areas in the active area to allow the Schottky barrier metal layer to link to the embedded p-well network, followed by an etch step to remove a surface portion of the n-layer above the peripheral region and in the guard ring area.
Figure 5B:
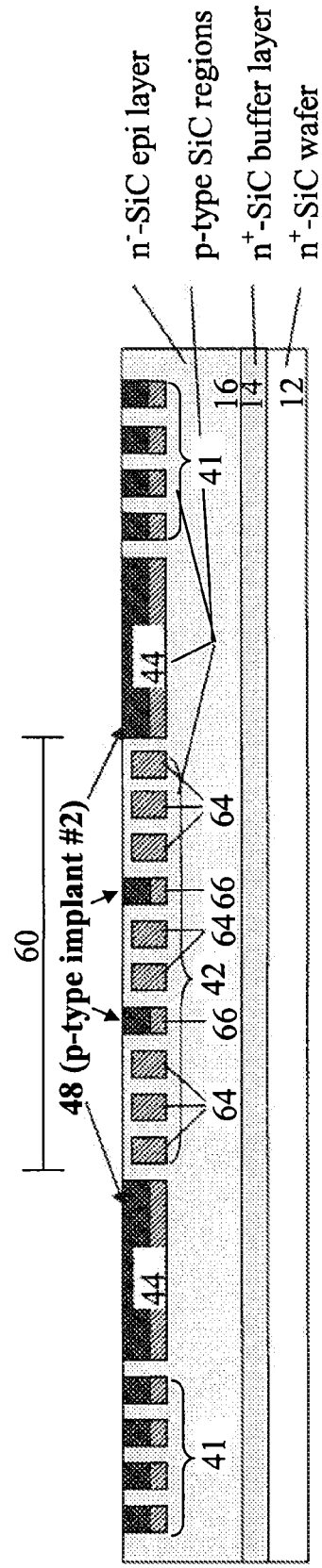
FIG. 5B is a cross-sectional diagram of a variation showing a second p-type implant in the peripheral region and guard ring regions at the same time with the selected areas in the active area.

FIG. 5A is a cross-sectional diagram of another embodiment showing a second p-type implant 148 in selected areas in the active area 60 to allow the Schottky barrier metal layer 52 to link to the embedded p-well network, followed by an etch step to remove a surface portion of the n-layer 16 above the peripheral region and in the guard ring area. FIG. 5B is a cross-sectional diagram of a variation showing a second p-type implant 48 in the peripheral region 44 and guard ring regions 41 at the same time with the selected areas in the active area 60. FIG. 5C is a cross-sectional diagram showing a first implant step of another embodiment in a process to avoid etching the material. FIG. 5D is a cross-sectional diagram showing a second implant step 49 of the process to avoid etching the material in the embodiment of FIG. 5C.

There are alternative ways other than FIG. 3C to expose the embedded p-wells, as shown in FIGS. 5A through 5C. In FIG. 5A, a second p-type implant 148 is performed in selected areas in the active area to allow the Schottky barrier metal layer 52 to link to the embedded p-well network, followed by an etch step to remove the surface portion of the n-layer 16 at the peripheral region 44 and in the guard ring 41 area. The second p-type implant 148 is performed such that contact may be made at the upper surface 104 to selected embedded p-wells 66, but contact may not be made at the upper surface 104 to the remaining embedded p-wells 64. To avoid an etching step and to simplify the process, an alternative second p-type implant 48 is performed in the peripheral and guard ring area at the same time with the selected area in the active area, as shown in FIG. 5B.

FIGS. 5C and 5D show another process to avoid etching the material. Referring to FIG. 5C, during the first p-type implant, only the grid 42 of p-wells in the active area is implanted. Referring to FIG. 5D, the peripheral region 44 and guard ring area 41, along with extensions of selected p-wells 66 in the device active area 60, are formed by a second p-type implant 49.

Having described and illustrated the principles of the invention in a preferred embodiment thereof, it should be apparent that the invention can be modified in arrangement and detail without departing from such principles. We claim all modifications and variations coming within the spirit and scope of the following claims.

The invention claimed is:

1. A semiconductor device comprising a layer of a first semiconductor type and a central active area formed in the layer, wherein the central active area further comprises:
   a first embedded well of a second semiconductor type;
   a second embedded well of the second semiconductor type; and
   a metal structure located on an upper surface of the layer; wherein:
   the first embedded well is spaced below the upper surface of the layer, and the metal structure contacts and forms a first Schottky barrier contact with the layer of the first semiconductor type spaced above the first embedded well; and
   the metal structure makes direct contact to the second embedded well of the second semiconductor type through the upper surface of the layer, and the metal structure forms a direct electrical contact with the second embedded well.

2. The semiconductor device of claim 1, wherein the first conductivity type is n-type and the second conductivity type is p-type.

3. The semiconductor device of claim 1, wherein the layer comprises an epitaxially deposited layer.

4. The semiconductor device of claim 1, wherein the layer comprises silicon carbide.

5. The semiconductor device of claim 1, wherein the layer comprises germanium, silicon, gallium arsenide, gallium nitride, indium phosphide, diamond, or a ternary derivative compound of group II and group VI elements.

6. The semiconductor device of claim 1, wherein the first embedded well and second embedded well have a lateral width of around 1 to 3 microns and are spaced apart from each other laterally by around 4 to 8 microns.

7. The semiconductor device of claim 1, the first embedded well and second embedded well include a p-type dopant implanted at a dose of around $1 \times 10^{13}$ cm$^{-2}$ to $6 \times 10^{15}$ cm$^{-2}$ and an energy of around 170 KeV to 400 KeV.

8. The semiconductor device of claim 1, further comprising a layer of the first conductivity type at the upper surface of the layer, wherein the layer is a shallow implanted layer.

9. The semiconductor device of claim 1, further comprising a layer of the first conductivity type at the upper surface of the layer, wherein the layer is an epitaxially deposited layer.

10. The semiconductor device of claim 1, wherein connectivity between the second embedded well and the metal structure through the upper surface of the layer is provided by an implant.

11. A method of fabricating a Schottky diode in a central active area of a semiconductor device, the method comprising:
   forming a layer of a first semiconductor type;
   forming a first embedded well of a second semiconductor type spaced below an upper surface of the layer;
   forming a second embedded well of the second semiconductor type to which contact may be made at the upper surface of the layer;
   forming a metal structure on the upper surface of the layer;
   contacting a first region of the metal structure to the layer over the first embedded well to form a Schottky barrier contact with the layer above the first embedded well; and
   contacting a second region of the metal structure to the second embedded well to form a direct electrical contact with the second embedded well.

12. The method of claim 11, wherein the first conductivity type is n-type and the second conductivity type is p-type.

13. The method of claim 11, wherein the layer is formed of an epitaxially deposited layer.

14. The method of claim 11, wherein the layer is formed of silicon carbide.

15. The method of claim 11, wherein the layer is formed of germanium, silicon, gallium arsenide, gallium nitride, indium phosphide, diamond, or a ternary derivative compound of group II and group VI elements.

16. The method of claim 11, wherein the first embedded well and second embedded well are formed to have a lateral width of around 1 to 3 microns and to be spaced apart from each other laterally by around 4 to 8 microns.

17. The method of claim 11, wherein the first embedded well and second embedded well are formed by a p-type dopant implant at a dose of around $1 \times 10^{13}$ cm$^{-2}$ to $6 \times 10^{15}$ cm$^{-2}$ and an energy of around 170 KeV to 400 KeV.

18. The method of claim 11, further comprising, preliminarily to forming the metal structure:
   forming a layer of the first conductivity type at the upper surface of the layer through shallow implantation.

19. The method of claim 11, further comprising, preliminarily to forming the metal structure:
   forming a layer of the first conductivity type at the upper surface of the layer through epitaxial deposition.

20. The method of claim 11, further comprising, preliminarily to forming the metal structure:
   forming an implant of the second semiconductor type to provide connectivity between the second embedded well and the upper surface of the layer.

21. The semiconductor device of claim 1 wherein the metal structure does not make direct contact with the first embedded well.

22. The semiconductor device of claim 1 wherein the central active area includes a peripheral region of the second semiconductor type in which a portion of the peripheral region is contacted by the metal structure.

23. The semiconductor device of claim 22 wherein the central active area is surrounded by a series of spaced floating guard rings of the second semiconductor type isolated from the metal structure by a passivation layer.

24. The semiconductor device of claim 1 wherein the first and second embedded wells are formed as an array of stripes.

25. The method of claim 11 wherein the metal structure does not make direct contact with the first embedded well.

26. The method of claim 11 wherein the central active area includes a peripheral region of the second semiconductor type in which a portion of the peripheral region is contacted by the metal structure.

27. The method of claim 25 wherein the central active area is surrounded by a series of spaced floating guard rings of the second semiconductor type isolated from the metal structure by a passivation layer.

28. The method of claim 11 wherein the first and second embedded wells are formed as an array of stripes.

29. The semiconductor device of claim 1, wherein connectivity between the second embedded well and the metal structure through the upper surface of the layer is provided by etching through the layer to the second embedded well.

30. The method of claim 11 wherein connectivity between the second embedded well and the metal structure through the upper surface of the layer is provided by an implant.

31. The method of claim 11 wherein connectivity between the second embedded well and the metal structure through the upper surface of the layer is provided by etching through the layer to the second embedded well.

32. A semiconductor device comprising a layer of a first semiconductor type and a central active area formed in the layer, wherein the central active area further comprises:
 a plurality of spaced-apart embedded wells of a second semiconductor type;
 a peripheral region of the second semiconductor type surrounding the plurality of embedded wells; and
 a metal structure located on an upper surface of the layer; wherein:
 the embedded wells are spaced below the upper surface of the layer, and the metal structure contacts and forms a first Schottky barrier contact with the layer of the first semiconductor type spaced above the embedded wells; and
 the metal structure makes direct contact to the peripheral region of the second semiconductor type.

33. The semiconductor device of claim 32 wherein the peripheral region is surrounded by a series of spaced floating guard rings of the second semiconductor type isolated from the metal structure by a passivation layer.

* * * * *

UNITED STATES PATENT AND TRADEMARK OFFICE
CERTIFICATE OF CORRECTION

PATENT NO.         : 7,851,881 B1                                          Page 1 of 1
APPLICATION NO.    : 12/365083
DATED              : December 14, 2010
INVENTOR(S)        : Feng Zhao, Bruce Odekirk and Dumitru Sdrulla It is certified that error appears in the above-identified patent and that said Letters Patent is hereby corrected as shown below:

Column 3, line 30, "p.m." should read --µm--;

"bather" should read --barrier-- in each of the following instances:
Column 3, line 22 and line 24;
Column 5, lines 51, 54, 58, 59, 67;
Column 6, lines 1, 4, 9, and 12.

Signed and Sealed this
Fifteenth Day of February, 2011

David J. Kappos
*Director of the United States Patent and Trademark Office*